United States Patent [19]

Berkcan et al.

[11] Patent Number: 5,416,408
[45] Date of Patent: May 16, 1995

[54] CURRENT SENSOR EMPLOYING A MUTUALLY INDUCTIVE CURRENT SENSING SCHEME WITH A MAGNETIC FIELD SUBSTANTIALLY UNIFORM IN ANGULAR DIRECTION

[75] Inventors: Ertugrul Berkcan, Schenectady; John E. Hershey, Ballston Lake, both of N.Y.

[73] Assignee: General Electric Company, Schenectady, N.Y.

[21] Appl. No.: 85,790

[22] Filed: Jul. 6, 1993

[51] Int. Cl.⁶ ............................................. G01R 1/20
[52] U.S. Cl. .................................. 324/127; 324/126; 324/117 R; 336/82
[58] Field of Search ................... 324/107, 108, 117 R, 324/127, 96, 47 R, 126; 336/82

[56] References Cited

U.S. PATENT DOCUMENTS

| | | |
|---|---|---|
| 2,831,164 | 4/1958 | Johnson . |
| 3,372,334 | 3/1968 | Fenoglio et al. . |
| 3,665,357 | 5/1972 | Tsubouchi et al. . |
| 3,921,069 | 11/1975 | Milkovic . |
| 3,995,210 | 11/1976 | Milkovic . |
| 4,140,961 | 2/1979 | Akamatsu . |
| 4,182,982 | 1/1980 | Wolf et al. . |
| 4,240,059 | 12/1980 | Wolf et al. . |
| 4,255,704 | 3/1981 | Milkovic . |
| 4,255,705 | 3/1981 | Milkovic . |
| 4,278,940 | 7/1981 | Milkovic . |
| 4,286,214 | 8/1981 | Milkovic . |
| 4,374,359 | 2/1983 | Missout ............................. 324/96 |
| 4,414,510 | 11/1983 | Milkovic . |
| 4,492,919 | 1/1985 | Milkovic . |
| 4,494,068 | 1/1985 | Ley et al. . |
| 4,495,463 | 1/1985 | Milkovic . |
| 4,513,274 | 4/1985 | Halder . |
| 4,580,095 | 4/1986 | DeVries . |
| 4,616,176 | 10/1986 | Mercure ............................. 324/127 |
| 4,626,778 | 12/1986 | Friedl . |
| 4,684,827 | 8/1987 | Ohms . |
| 4,794,326 | 12/1988 | Friedl . |
| 4,810,989 | 3/1989 | Brandenberg et al. . |
| 4,835,463 | 5/1989 | Baran et al. . |
| 4,894,610 | 1/1990 | Friedl . |
| 4,939,451 | 7/1990 | Baran et al. . |
| 4,947,107 | 8/1990 | Doerfler et al. . |
| 4,999,692 | 3/1991 | Ristic et al. . |
| 5,027,059 | 6/1991 | de Montgolfier et al. . |
| 5,066,904 | 11/1991 | Bullock . |
| 5,107,204 | 4/1992 | Bullock ............................. 324/127 |

OTHER PUBLICATIONS

"Electrical Measurements" by Frank A. Laws, Massachusetts Institute of Technology-Electrical Engineering Texts–pp. 72–75, 1938.

"Faraday Effect Sensors: The State of the Art," G. W. Day, A. H. Rose, SPIE vol. 985, Fiber Optic and Laser Sensors VI (1988), pp. 138–150.

"Integrated Semiconductor Magnetic Field Sensors," Henry P. Baltes, Proceedings of the IEEE, vol. 74, No. 8, Aug. 1986, pp. 1107–1132.

"GE Type EV and Phase 3 Meters, Signal Conditioning and Scaling," Donald F. Bullock, David D. Elmore, GE Meter & Control Business, Somersworth, N.H. 03878, Mar. 1991.

Primary Examiner—Kenneth A. Wieder
Assistant Examiner—Mark Wardas
Attorney, Agent, or Firm—Enrique J. Mora; Marvin Snyder

[57] ABSTRACT

An alternating current sensor employing a mutually-inductive current sensing scheme comprises a conductive pipe and a cylindrical-shaped conductive element at least partially surrounded by the pipe. The pipe is substantially concentric to the conductive element and a conductor electrically connects a pair of corresponding ends of the pipe and conductive element to form a connected conductive path through the sensor. The pipe and the conductive element are spaced apart a predetermined radial distance to form a magnetic field in the space between the pipe and conductive element during current flow along the conductive path.

10 Claims, 5 Drawing Sheets

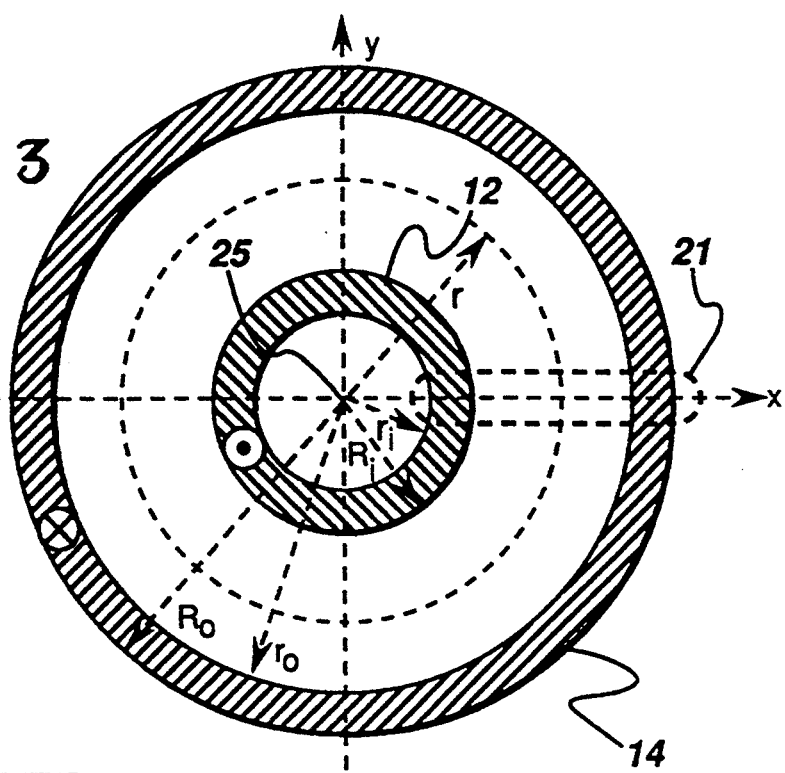
fig. 3
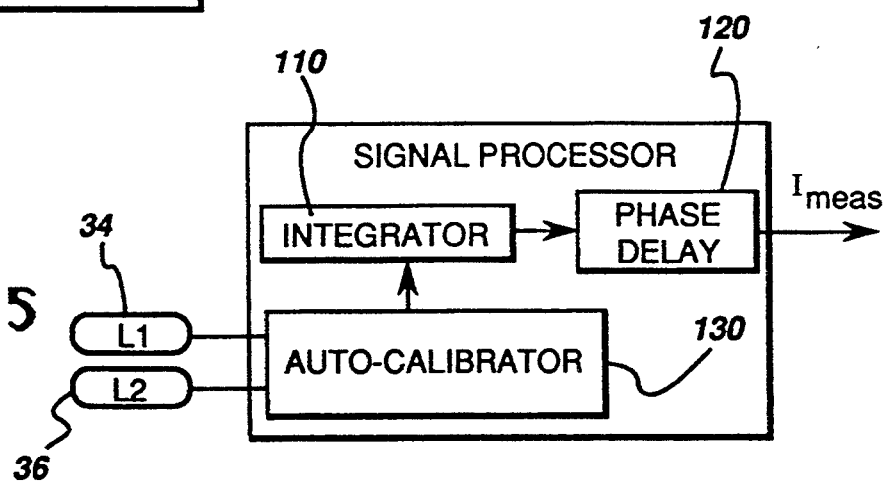
fig. 4
fig. 5

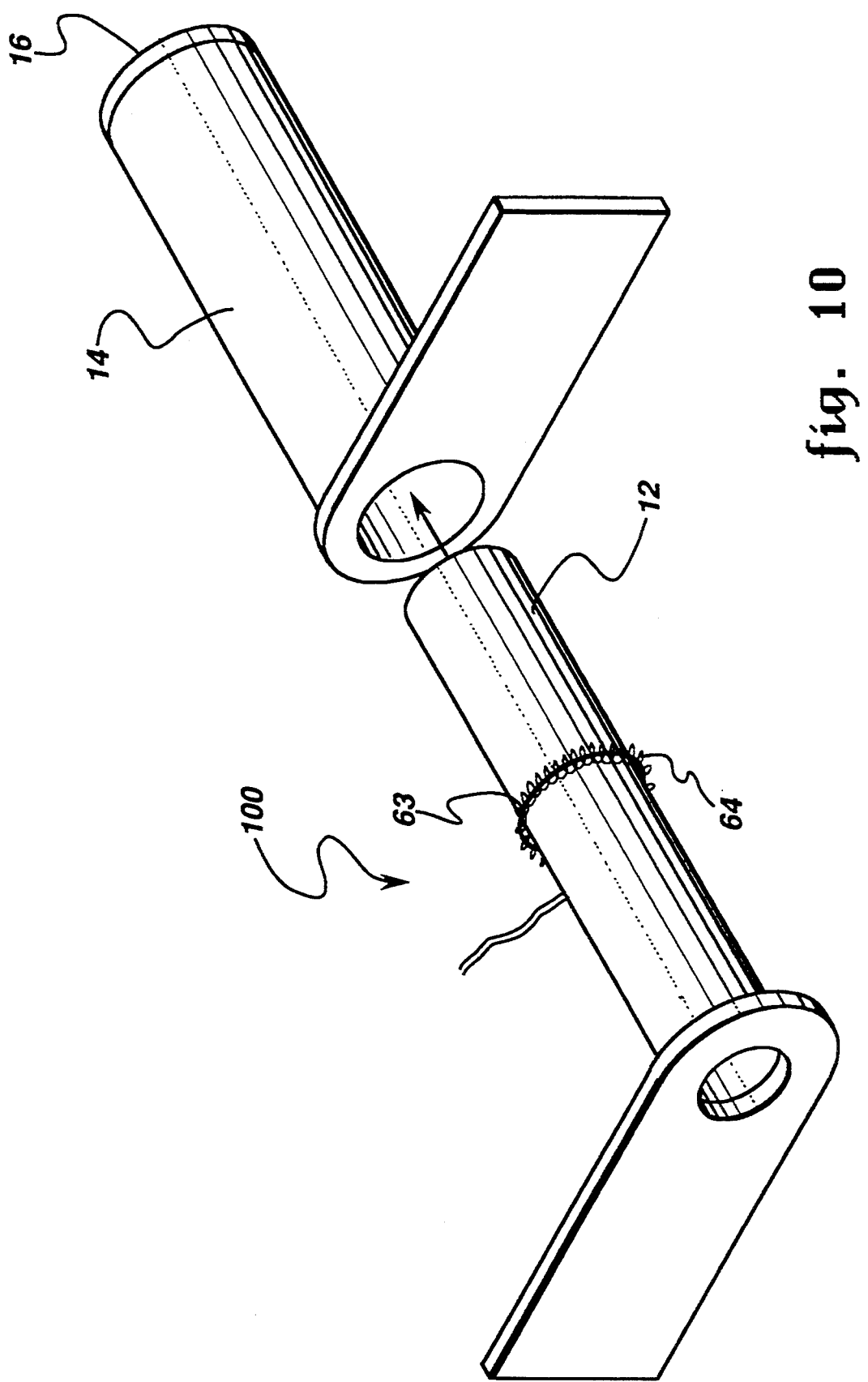

CURRENT SENSOR EMPLOYING A MUTUALLY INDUCTIVE CURRENT SENSING SCHEME WITH A MAGNETIC FIELD SUBSTANTIALLY UNIFORM IN ANGULAR DIRECTION

RELATED APPLICATIONS

This application is related to patent application Ser. No. 08/085,787 (RD-22,251) entitled "Noninductive Shunt Current Sensor," by Berkcan, filed Jul. 6, 1993, patent application Ser. No. 08/085,789 (RD-22,357) entitled "Current Sensor Employing a Mutually Inductive Current Sensing Scheme," by Berkcan et al, filed Jul. 6, 1993, and patent application Ser. No. 08/085,789 (RD22,349) entitled "Reduced Flux Current Sensor," by Berkcan, filed Jul. 6, 1993, all of the foregoing assigned to the assignee of the present invention and herein incorporated by reference.

1. Field of the Invention

The present invention relates to a current sensor and, more particularly, to a current sensor employing a mutually inductive current sensing scheme.

2. Background of the Invention

Current sensors that employ mutually inductive current sensing schemes are generally known in the art. However, in a three-phase system or network such current sensors may have problems regarding the sensitivity or accuracy of the current sensor due to mutual coupling between the three phases of alternating voltage provided.

Techniques are known to reduce the mutual coupling between the current sensors in such a three-phase network or system. One technique for accomplishing this is to introduce magnetic insulation. Unfortunately, such magnetic insulation may introduce other problems in that the insulation may become saturated due to the strength of direct current components of the magnetic field and, furthermore, such insulation may not be economical for some current sensing applications or may introduce additional size and bulk, especially due to the need for materials able to provide satisfactory insulation. A need thus exists for a method or device for sensing current employing mutual inductance that overcomes these disadvantages.

SUMMARY OF THE INVENTION

One object of the invention is to provide a current sensor that employs a mutually inductive current sensing scheme.

Another object of the invention is to provide a current sensor that does not require magnetic insulation for satisfactory operation in a three-phase network or system.

Yet another object of the invention is to provide a current sensor that has the capability to produce a magnetic field substantially uniform in angular direction within the current sensor.

Briefly, in accordance with one embodiment of the invention, an alternating current sensor employing a mutually-inductive current sensing scheme comprises a conductive pipe and a cylindrical-shaped conductive element at least partially surrounded by the pipe. The pipe is substantially concentric to the conductive element and a conductor electrically connects a pair of corresponding ends of the pipe and conductive element to form a connected conductive path through the sensor. The pipe and the conductive element are spaced apart a predetermined radial distance to form a magnetic field in the space between the pipe and conductive element during current flow along the conductive path.

BRIEF DESCRIPTION OF THE DRAWINGS

The subject matter regarded as the invention is particularly pointed out and distinctly claimed in the concluding portion of the specification. The invention, however, both as to organization and method of operation, together with further objects and advantages thereof may be best be understood by reference to the following detailed description when read with the accompanying drawings in which:

FIG. 3 is a cross-sectional front view of the embodiment of FIG. 2 taken through the plane illustrated in FIG. 1 substantially perpendicular to the major axis of that embodiment.

FIG. 4 is a back cross-sectional view of the embodiment of FIG. 1.

FIG. 5 is an alternative embodiment of a current sensor in accordance with the invention, including components for performing signal processing.

FIG. 10 is a perspective view of another alternative embodiment of a current sensor in accordance with invention.

DETAILED DESCRIPTION OF THE INVENTION

Figure 1:
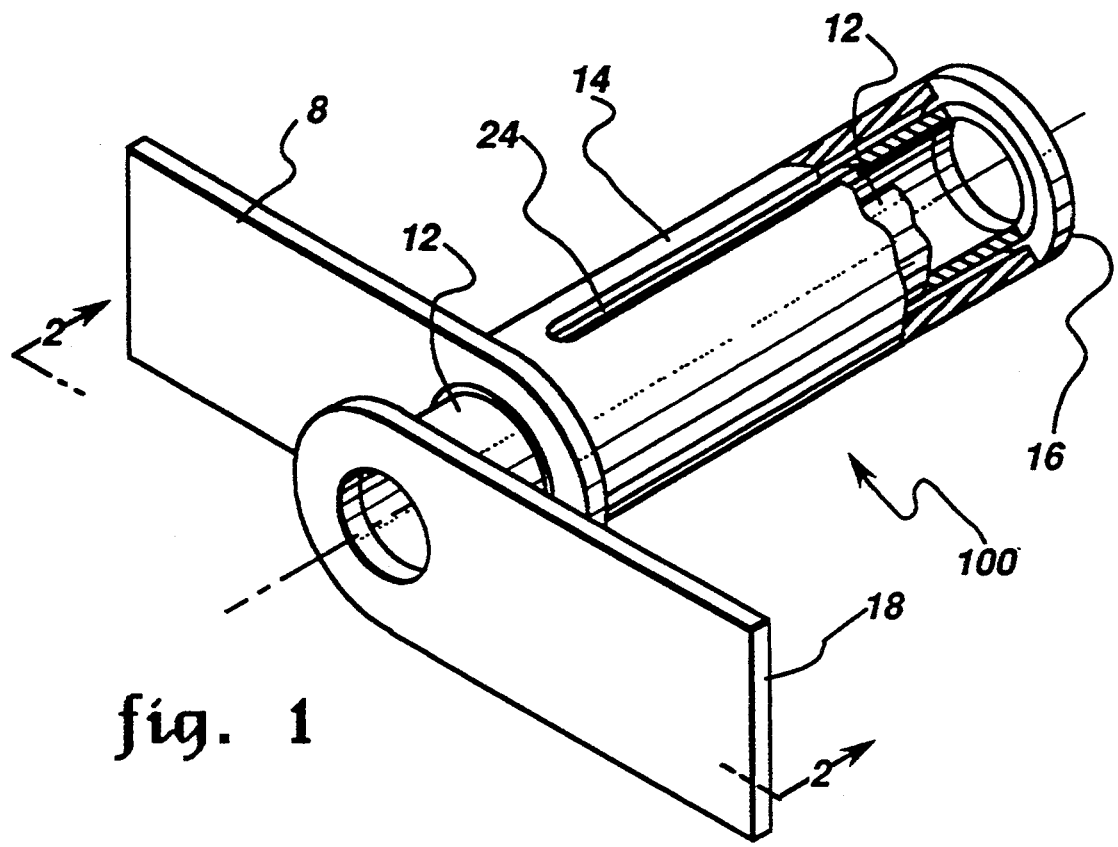
FIG. 1 is an isometric, partially cut-away view of one embodiment of a current sensor in accordance with the invention.
Figure 2:
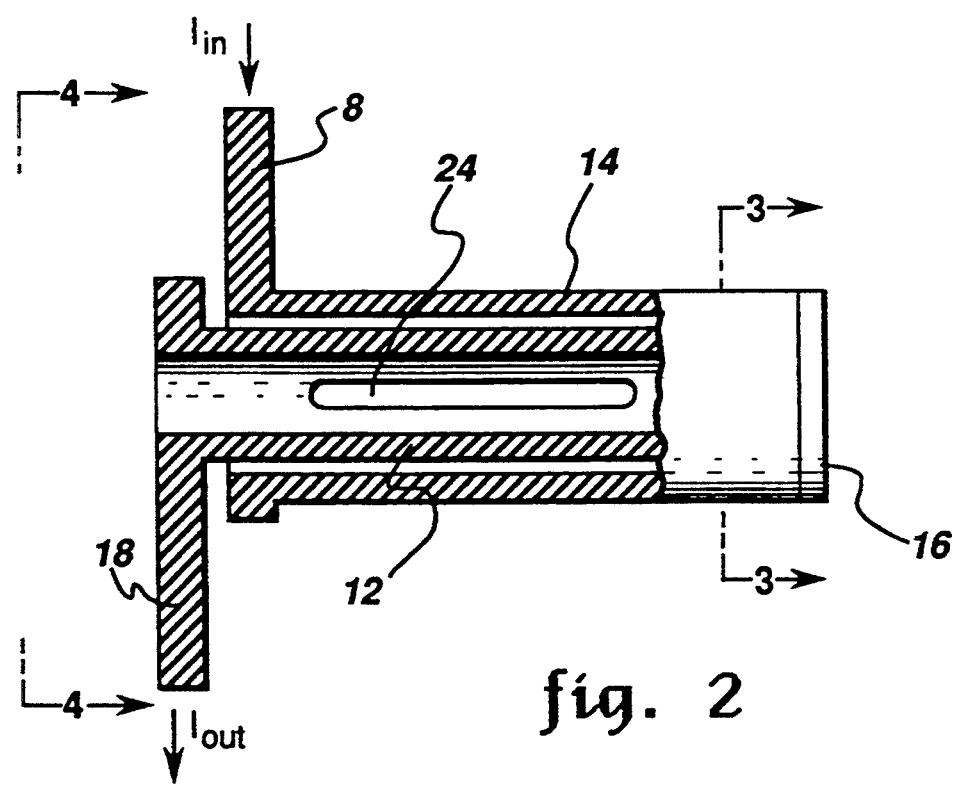
FIG. 2 is a partially cut-away cross-sectional top view of the embodiment of FIG. 1.

FIG. 1 illustrates one embodiment of a current sensor 100 employing a mutually inductive current sensing scheme in accordance with the invention. As illustrated in FIG. 2, input current, $I_{in}$, is carried by a conductor 8, such as a conductive plate, to a pair of nested concentric metal pipes or hollow cylinders, cylinder 12 being the inner cylinder and cylinder 14 being the outer cylinder. Inner cylinder 12 may alternatively take the form a solid cylindrical-shaped conductive element, although in this particular embodiment the conductive element is hollowed along its major axis extending from a first end to a second end to form a pipe. The outer cylinder 14 also forms a conductive pipe having a first end, a second, and a major axis extending from the first end to the second end.

Inner pipe 12 is at least partially surrounded by outer pipe 14 and has a major axis substantially coincident with the major axis of the outer pipe. Furthermore, in this particular embodiment, the inner pipe has a first end extending beyond the first end of the pipe and a second end substantially coplanar with the second end of the pipe. Nonetheless, the invention is not limited in scope to embodiments in which the current sensor has one end in which the concentric pipes are coplanar. Likewise, the invention is not limited in scope to embodiments in which the end of one pipe extends beyond the corresponding end of the other pipe.

A conductive end piece or washer 16 electrically and physically connects the respective second ends of the pipe and the cylindrical element together. Except for end-piece 16, an insulating material, such as an air gap or other insulating material, such as Kapton ™ available from the dupont Company, isolates the inner surface of the outer pipe from the outer surface of the inner pipe. Thus, a connected path for current flow is thereby established, such as further illustrated in FIG. 2. The current, $I_{out}$, leaves the current sensor by conductor 18.

As illustrated in FIGS. 1 and 2, both the inner pipe and the outer pipe, in this particular embodiment, have slots or openings 24 extending from the outer surface of outer pipe 14 to the inner surface of inner pipe 12. However, in an embodiment in which a solid conductive element is employed in place of pipe 12, the slot extends only from the outer surface to the inner surface of pipe 14. Another slot or opening may also be located on the opposite side of the current sensor, as illustrated in FIG. 4 showing a cross-sectional back view of the embodiment of the current sensor illustrated in FIG. 1. The embodiment of FIG. 1 further includes elements or sensors for sensing the time rate of change in magnetic flux, such as coils 34 and 36 illustrated in FIG. 4, adapted to be received within the respective slots. More particularly, the changing magnetic flux sensors or sensing elements are adapted to interact with the time varying magnetic field produced within the current sensor during current flow along the conductive path through the current sensor. The cross-sectional area of the sensing element may be oriented at a predetermined angle with respect to the direction of the magnetic field of the current sensor. This is illustrated in FIG. 3 by induction loop 21, although any conducting path through which the flux of the magnetic field passes will suffice. In this particular embodiment, the cross-sectional area of the sensing element or sensor for sensing changes in magnetic flux is oriented substantially perpendicular to the direction of a magnetic field substantially uniform in angular direction relative to the major axis of the current sensor. Thus, this particular embodiment of current sensor 100 employing a mutually inductive current sensing scheme is adapted to produce a magnetic field within the current sensor substantially uniform in angular direction during current flow along the conductive path of the current sensor.

Current sensor 100 uses the measurement of the voltage generated as a result of the time rate of change of the magnetic flux through the coils inserted or positioned in slots 24 and 26, respectively, for sensing the value of the current flow. In this particular embodiment, the voltage due to the emf is measured across the coils connected in series in a reverse configuration. This series connection has an advantage in that it provides twice as much voltage signal in comparison with a single slot and a single coil. Likewise, external uniform magnetic fields are cancelled due to the reverse series connection, an advantage associated with producing a magnetic field substantially uniform in angular direction.

Due to the geometry employed, as explained in more detail hereinafter, substantially no magnetic field is present outside the outer surface of outer pipe 14. This provides a number of advantages, not the least of which being that the use of such a current sensor in a three-phase system reduces or substantially eliminates the mutual coupling between the current sensors thus improving the sensitivity and accuracy of the current measurements obtained. Both outer pipe 14 and inner pipe 12, or the alternative cylindrical-shaped element, may be manufactured using materials having a small temperature coefficient of resistance, such as on the order of 20 ppm per degree centigrade, such as may be provided by metal alloys including ADVANCE ™, KARMA ™, NIKROTHALLX ™, as well as m other materials. Likewise, various metals, such as copper, silver, or gold, and combinations thereof may be employed.

FIG. 3 illustrates a cross-sectional front view of the embodiment illustrated in FIG. 1 taken through the plane illustrated in FIG. 1 perpendicular to the outer wall of pipe or outer cylinder 14. The magnitude of the magnetic field within various concentric circles substantially centered about point 25 is provided by the following equations:

$$H(r) = \begin{cases} 0, & r \leq r_i, r \geq R_o \\ \dfrac{I}{2\pi r} \dfrac{r^2 - r_i^2}{R_i^2 - r_i^2} & r_i \leq r \leq R_i \\ \dfrac{I}{2\pi r} & R_i \leq r \leq r_o \\ \dfrac{I}{2\pi r} \dfrac{R_o^2 - r^2}{R_o^2 - r_o^2} & r_o \leq r \leq R_o \end{cases} \quad [1]$$

where I is the current along the conductive path of the current sensor, H(r) is the magnitude of the magnetic field in the region indicated, and, as illustrated in FIG. 3, r, $r_i$, $r_o$, $R_o$ and $R_i$ constitute the respective radii of cylinders centered about point 25 on the major axis of pipes 12 and 14 as follows:

$r_i$ is the radius of the inner surface of pipe 12;

$R_i$ is the radius of the outer surface of pipe 12;

$r_o$ is the radius of the inner surface of pipe 14;

$R_o$ is the radius of the outer surface of pipe 14, and r is the radius of an imaginary concentric cylinder centered about point 25 within the current sensor.

As the previous expressions illustrate, the magnetic field induced by the current flow through the current sensor is substantially null in the space within inner cylinder 12 and the space outside outer cylinder 14. Thus, one advantage of using an inner pipe instead of a solid conductive cylindrical element is that the energy of the magnetic field is concentrated between the pipes. In those embodiments in which the cylindrical-shaped element is not hollowed the magnetic field would not be null in the space occupied by the element because current flow would take place through the element.

Although the flux may be calculated for the general case by the following equation $$\mu_o \int_s \bar{H}(r) \cdot d\bar{s} = \Phi, \quad [2]$$

the following special case of a constant ratio provides a useful embodiment:

$$\rho = \frac{R_i}{r_i} = \frac{R_o}{r_o}. \quad [3]$$

For this case by performing the relevant integration of the magnetic flux indicated by equation [2], the following equation is obtained:

$$\phi = \mu_0 \frac{NLI}{2\pi} \ln\left(\frac{r_o}{r_i}\right), \qquad [4]$$

where $\mu_o$ is the permeability of free space, L is the length of a loop in the direction substantially parallel to the major axis of the sensor, N is the number of turns in the loop, and I is the current, as previously indicated.

A current sensor employing a mutually inductive current sensing scheme in accordance with the present invention has a number of advantages. First, as previously suggested, there is substantially no magnetic field inside or outside the two cylinders. This is particularly advantageous for metering applications, where, as previously discussed, several current sensors are employed in close proximity to each other, such as in a three-phase network. Likewise, this avoids the need for magnetic insulation which is undesirable and, furthermore, may not provide effective insulation in the presence of strong magnetic fields with DC components in which the material may be saturated. Yet another advantage is that the current sensor is relatively insensitive to external magnetic fields and other sources of noise. This occurs because the sensing elements or sensors for sensing changes in magnetic flux are coupled in series in a reverse configuration so that the effects of substantially uniform external magnetic fields essentially cancel due to the changes in magnetic flux through the sensing elements This insensitivity also applies in relation to direct current where no voltage would be induced due to the absence of a changing magnetic flux. Yet another advantage of a current sensor in accordance with the invention is that the magnetic flux is concentrated in the space constituting the predetermined radial distance or separation between the inner surface of the outer pipe and the outer surface of the inner cylindrical element or pipe, thus improving accuracy in addition to simplifying the current sensor structure, and making it relatively easy to manufacture. Furthermore, several sensing elements or sensors for sensing the time rate of change of magnetic flux may be inserted at arbitrary locations between the outer pipe and the inner cylindrical conductive element, thus providing a better measurement of the current due to the improved signal obtained, as previously suggested.

A number of other embodiments of a current sensor employing a mutually inductive current sensing scheme in accordance with the present invention are likewise possible. For example, as shown in FIG. 10 a ferromagnetic material 63, such as ferrite or $\mu$-metal, may be inserted between the inner surface of outer pipe 14 and the outer surface of the inner pipe or cylindrical element 12. This may have the desirable effect of increasing the sensitivity of the current sensor still further by increasing the concentration of the magnetic field in the space between the pipes. Likewise, instead of placing coils or other elements for sensing changes in magnetic flux in slots 24 and 26, an air-core or Kapton TM embedded toroidal-shaped coil 64 may be inserted in the space between the outer pipe and the cylindrical element or inner pipe. Thus, by increasing the number of loops or turns in the sensing element of the current sensor, this has the desirable effect of increasing the dynamic range and accuracy of the current sensor. For this embodiment slots would not be necessary because sensing wires between the outer pipe and cylindrical element could provide the induced voltage signal without a degradation in performance due to the effect of the magnetic field present.

FIG. 5 illustrates an alternative embodiment of a current sensor employing a mutually inductive current sensing scheme in accordance with the invention. Coils 34 and 36 are coupled to a signal processor 150 including an autocalibrator 130, an integrator 110, and a phase delay 120. As illustrated, this embodiment offers an additional advantage in that an autocalibration may be performed by comparing the voltages in the two coils or other sensing elements respectively. Thus, if one coil is not properly placed it may nonetheless be calibrated relative to the other coil. This autocalibration comparison also offers robust measurements in the presence of external magnetic fields or temperature variations. Furthermore, it provides the capability to make adjustments to the current measurements without physically or mechanically modifying the current sensor. As illustrated, following calibration or autocalibration, the induced voltage is integrated. This is performed because the induced voltage is proportional to the time derivative of the current. Next, the signal is phase delayed following the integration. This is performed to correct for any phase errors introduced by the integration.

Figure 6:
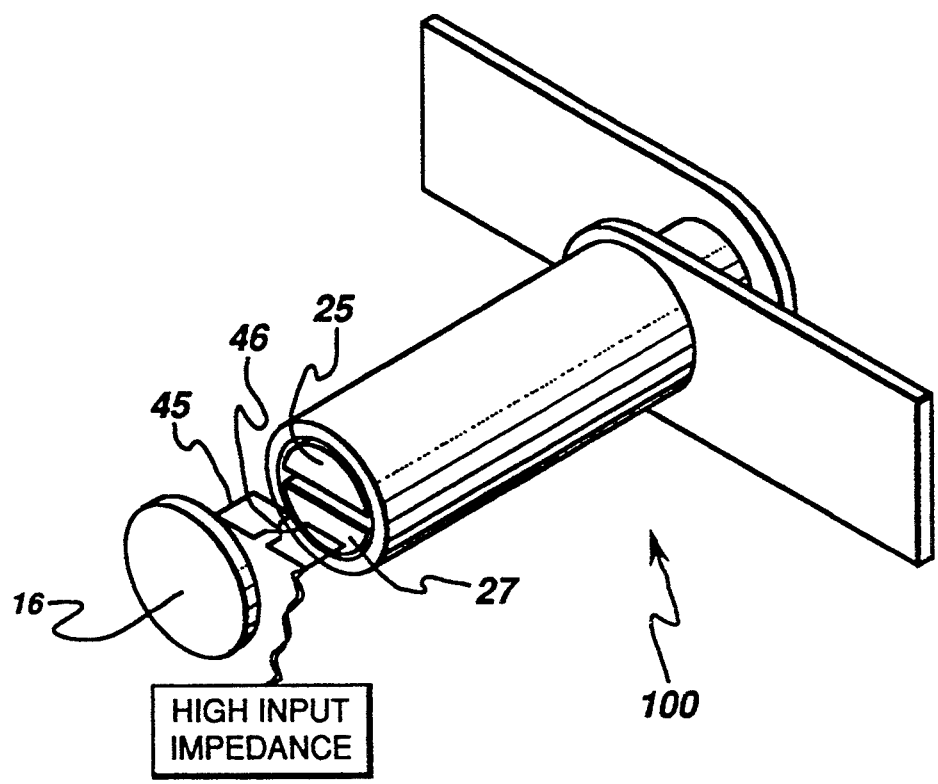
FIGS. 6 and 7 are, respectively, prospective and cross-sectional views of another alternative embodiment of a current sensor in accordance with the invention.

An alternative embodiment of a current sensor 100 employing a mutually inductive current sensing scheme is illustrated in FIG. 6. In this embodiment cylindrical element 12 is comprised of two substantially identical conductive hemi-cylinders 25 and 27 having an opening or physical separation of a predetermined distance between them. Thus, the hemi-cylinders each have opposing substantially flat faces a predetermined distance apart. A bow tie-shaped sensor or sensing element 45 for sensing the time rate of change in the magnetic flux is inserted or sandwiched between the two hemi-cylinders to measure the time rate of change of the magnetic flux through the coils in the bow tie-shaped sensor. Sensing element 45 thus comprises two coils connected in a reverse series configuration, as illustrated in FIG. 6. In contrast with the previous embodiment, in this particular embodiment the magnetic field is established in the space between the solid hemi-cylinders. End-piece 16 completes the conductive path through the current sensor, as described earlier. For this particular embodiment, the bow tie-shaped sensing element should lie in a plane that includes the major axis of the current sensor and is substantially parallel to the opposing faces of the hemi-cylinders. Likewise, each of the two coils should lie on opposite sides of the major axis of the conductive element. Thus, the major axis should contain cross point 46 of the bow tie-shaped sensing element. One reason for this is that the magnetic field created in the passage between the two hemi-cylinders during current flow through the current sensor has 180° rotational symmetry. Thus, like the embodiment illustrated in FIG. 1 in which two coils are employed, this has the advantage of effectively doubling the voltage signal measurement obtained and thereby improving the signal strength for the current measurement while also cancelling the effect of external uniform magnetic fields. In the limit, as the distance between the opposing faces goes to zero, the magnetic field created is substantially uniform in angular direction relative to the major axis of the current sensor like the magnetic field between the concentric pipes of the previous embodiment. Furthermore, the magnetic field lines along the plane of the bow tie-shaped sensing element previously described are substantially parallel to each other and substantially perpendicular to the plane.

Another advantage associated with the embodiment illustrated in FIG. 6 may be demonstrated by computing the magnetic flux. Inside the two hemi-cylinders, current density j will be $$J = \frac{I}{\pi R^2}, \quad [5]$$

where R is the radius of the effective cylinder comprised of the two hemi-cylinders. Likewise, performing the integration $$\int \bar{H} \cdot dl = I, \quad [6]$$

yields $$2\pi r H_r = \int\int_s J d\bar{s} \quad [7]$$
$$= \frac{I}{\pi R^2} \cdot \pi r^2,$$

providing $$H = \frac{I}{2\pi R^2} r. \quad [8]$$

Thus, the magnetic flux may be expressed as the proportion $$\Phi \alpha \int\int_s H dS, \quad [9]$$

Thus, $$\Phi \alpha \frac{IL}{2\pi R^2} \int_0^R r dr = \frac{L}{4\pi} I, \quad [10]$$

where L is the length of the bow tie-shaped sensing element along the major axis of the current sensor 100. As equation [10] illustrates, the magnetic flux is linear with I, the current through the conductive path of current sensor 100, and independent of R, the radius of the cylinder formed by the two hemi-cylinders. As the temperature increases and the hemi-cylinders expand, the error in the voltage measurement obtained by using the bow-tie shaped sensing element will be incorrect by an increment on the order of the length, not the length squared ($L^2$). Thus, for a typical coefficient of thermal expansion, such as $16.1 \times 10^{-6}$ parts per degree centigrade for copper, this will introduce a relatively small error over a relatively large temperature range.

Figure 8:
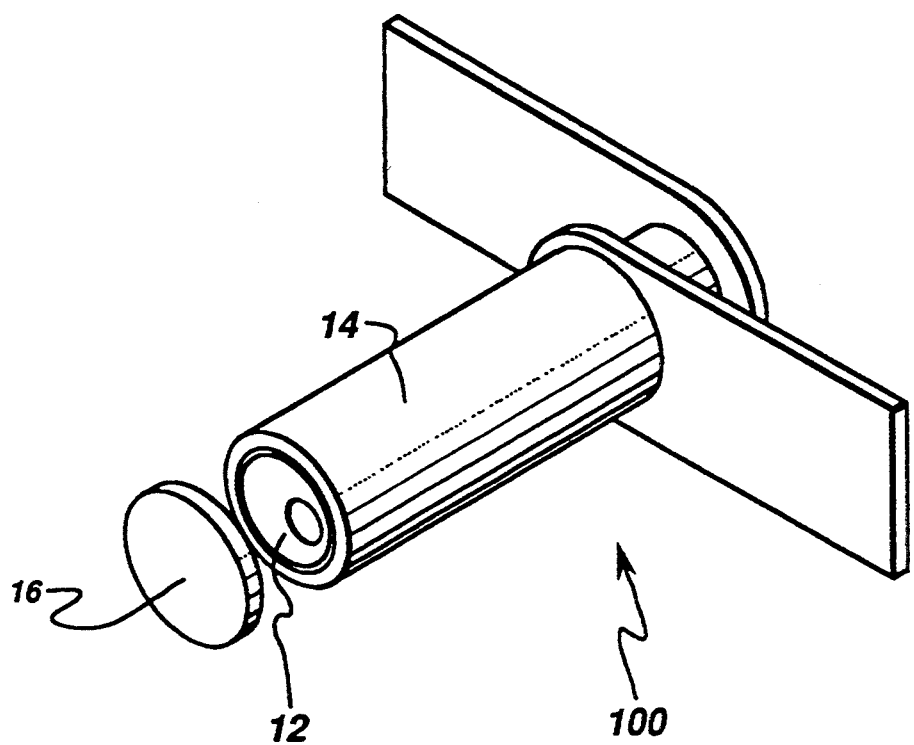
FIGS. 8 and 9 are, respectively, prospective and cross-sectional views of another alternative embodiment of a current sensor in accordance with the invention.
Figure 9:
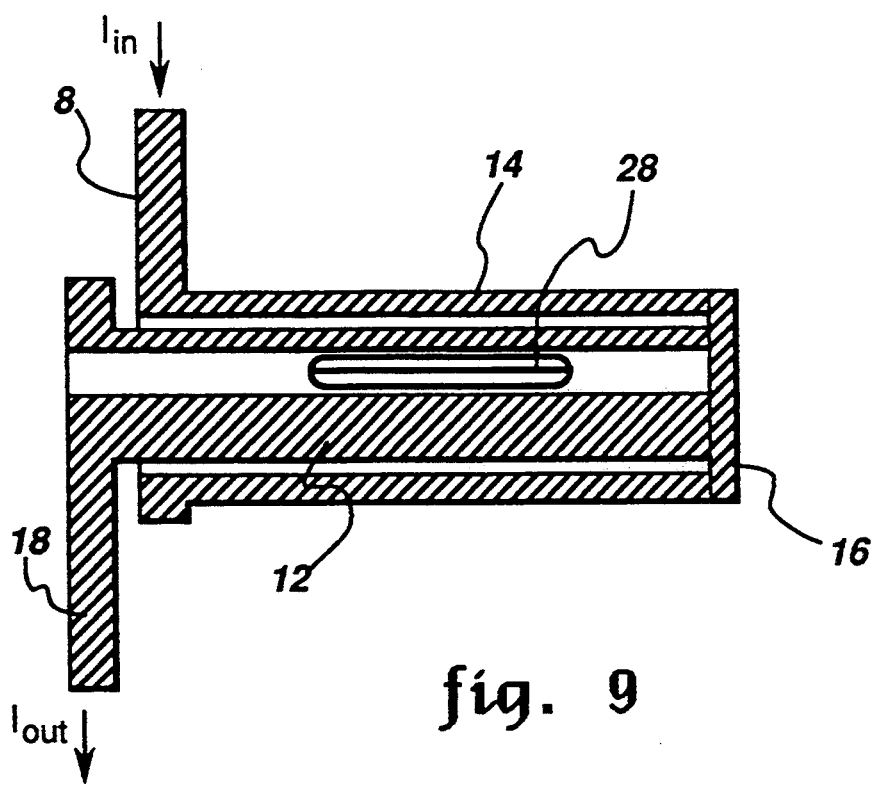

Yet another embodiment of a current sensor employing a mutually inductive current sensing scheme is illustrated in FIGS. 8 and 9. In this particular embodiment conductive cylindrical element 12 includes a cylindrical-shaped hole or passage of radius "a" bored within the solid cylindrical element of radius "b," where "b" exceeds "a," such that the hole or cylindrical-shaped passage extends from the first end of the cylindrical element to the second end of the cylindrical element and has a major axis substantially parallel to the major axis of the cylindrical element. Furthermore, the major axis of the passage is offset a predetermined distance "c" from the major axis of element 12, where c is less than (b−a). Thus, during the flow of current along the conductive path, a magnetic field substantially uniform in direction and substantially constant in magnitude is present within the hole or cylindrical-shaped passage or opening. The direction of the field will be at right angles to a line segment which joins the major axis of cylindrical element 12 to the major axis of the through hole or passage in the cylinder. It may be demonstrated that if the diameter of the holed cylinder is b and if a current I is conducted through the holed cylinder, the magnitude of the flux within the hole per unit length is proportional to $$\frac{acI}{\pi(b^2 - a^2)}. \quad [11]$$

See for example, W. K. H. Panofsky and M. Phillips, *Classical Electricity and Magnetism*, New York: Addison-Wesley (1962), at p. 156.

As illustrated in FIGS. 8 and 9, the magnetic fields produced by having the cylindrical conductive element conduct relatively large currents may be substantially reduced or eliminated in the manner previously described, that is by substantially offsetting the magnetic field produced by the current flow through conductive element 12 with the magnetic field produced by the current flow through outer pipe 14. Such a geometry effectively reduces to near zero the magnitude of the external magnetic field of such a current sensor. Thus, a sensor or sensing element for measuring changes in magnetic flux may be positioned within the through passage of the holed cylinder at a sufficient distance away from either open end of the current sensor housing and away from conductor or washer 16 so as to not significantly degrade the current sensor measurements.

In this particular embodiment of current sensor 100, a biaxial inductive coil 28 may be inserted within the passage of the holed cylinder to operate as the sensor or sensing element for sensing changes in magnetic flux. The biaxial inductive coil comprises two coils of substantially identical cross-sections and the same number of coil turns or loops connected in series and oriented so that the changes in magnetic flux through both coils is relatively insensitive to small angular displacements within the passage in conductive element 12, such as by having the two coils oriented with substantially mutually perpendicular cross-sectional areas.

A method of measuring electrical current flow by mutual induction may be carried out in the following manner. An electrical current is conducted through a cylindrical-shaped conductive element in a first direction, such as conductive element 12. Electrical current is also conducted through a conductive cylindrical pipe in a second direction opposite the first direction, the pipe being substantially concentric with the conductive element, such as cylindrical pipe 14. Typically, the same current shall be conducted in both directions, although it will be appreciated that the invention is not limited in scope to the order of the electrical conduction through either the pipe or the cylindrical-shaped conductive element. However, in either case the two directions of conduction should oppose each other. This may be accomplished by a conductive bridge or washer, such as previously described, electrically connected corresponding ends of the conductive element and concentric pipe. Thus, reversing polarity should have the effect of changing the order of electrical conduction through the pipe and cylindrical element.

The conductive element has an outer surface and the cylindrical pipe has an inner surface. Thus, the time rate of change of the magnetic flux in the space between the outer surface of the conductive element and the inner surface of the pipe may be measured. This may be measured in a number of different ways. For example, a changing magnetic flux sensing element or sensor, such as a coil, may be located in the space between the outer surface of the conductive element and the inner surface of the pipe. Likewise, the coils may be located in the space through slots in the pipe or pipes, as previously described.

Figure 7:
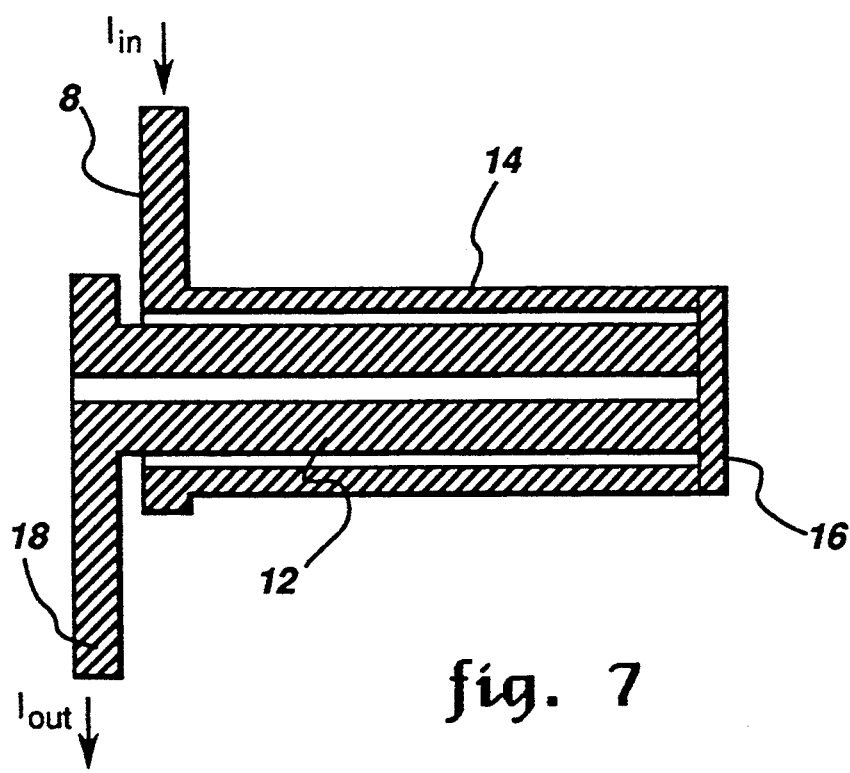

Alternatively, the cylindrical-shaped conductive element may have a first end and a second end and a passage extending from the first end to the second end, such as illustrated in FIGS. 6, 7, 8 and 9. Thus, instead of measuring the time rate of change of the magnetic flux in the space between the outer surface of the conductive element and the inner surface of the pipe, the time rate of change of magnetic flux may be measured in the passage in the conductive element. The passage may be shaped to form a magnetic field substantially uniform in direction and constant in magnitude when the electrical current is conducted through the conductive element, such as illustrated in FIGS. 8 and 9. To accomplish this, the cylindrical element may have a first end, a second end, and a major axis extending from the first end to the second end and the passage may be substantially cylindrical-shaped having a major axis substantially parallel to and offset a predetermined distance from the major axis of the cylindrical-shaped element. Alternatively, as illustrated in FIGS. 6 and 7, the cylindrical-shaped element may comprise two substantially identical hemi-cylinders each having a substantially flat face, the respective faces opposing each other and being separated by a predetermined distance to form the passage. In this case, the magnetic field formed along a plane midway between the hemi-cylinders and substantially parallel to the opposing faces has substantially parallel magnetic field lines, the field lines being substantially perpendicular to the plane. Again, the time rate of change of the magnetic flux may be measured in this passage, such as with a bow tie-shaped sensing element comprising two coils in series as previously described.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An alternating current sensor comprising:
   a conductive pipe having a first end, a second end, an inner surface, an outer surface and a major axis extending from the first end to the second end, each of said inner and outer surfaces extending along said major axis from the first end to the second end of said conductive pipe;
   a cylindrical-shaped conductive element, at least partially surrounded by said pipe, having a first end, a second end, and a major axis extending from the first end of said conductive element to the second end of said conductive element; and
   a conductor electrically connecting the respective second ends of said pipe and said conductive element so as to form a connected conductive path between the first end of said pipe and the first end of said conductive element;
   said pipe and said conductive element being electromagnetically coupled to one another for providing a mutually-inductive current sensing scheme in said alternating current sensor and being spaced apart a predetermined radial distance to form a magnetic field in the space between said pipe and said conductive element during current flow along said connected conductive path.

2. The alternating current sensor of claim 1, wherein the magnetic field formed in the space between said pipe and said conductive element during current flow along said connected conductive path is substantially uniform in angular direction.

3. The alternating current sensor of claim 2, and further comprising a sensor, in the space between said pipe and said conductive element, for sensing the time rate of change of magnetic flux.

4. The alternating current sensor of claim 3, wherein said pipe has at least one slot extending from the inner surface to the outer surface of said pipe, said slot being shaped to receive said magnetic flux sensor.

5. The alternating current sensor of claim 3, wherein said magnetic flux sensor comprises a toroidal-shaped coil having a plurality of coil loops, said coil being positioned in the space between the outer surface of said conductive element and the inner surface of said pipe, each respective cross-sectional area enclosed by respective ones of the coil loops being oriented substantially perpendicular to the direction of the magnetic field.

6. The alternating current sensor of claim 5, wherein said toroidal coil is wound in the space between said pipe and said conductive element around a ferromagnetic material.

7. The alternating current sensor of claim 4, and further comprising another sensor for sensing the time rate of change of magnetic flux, said pipe having at least one other slot extending from the inner surface to the outer surface of said pipe;
   said one other slot being shaped to receive said another magnetic flux sensor.

8. The current sensor of claim 4, wherein said conductive element has a passage extending from the first end to the second end of said conductive element so as to form another conductive pipe;
   said another conductive pipe having an inner surface, an outer surface, and a slot extending from the inner surface to the outer surface of said another conductive pipe;
   the slots in said pipes being substantially overlapping.

9. The alternating current sensor of claim 8, and further comprising at least one other sensor for sensing the time rate of change of magnetic flux;
   wherein each respective conductive pipe has at least one other slot, the one other slot extending from the inner surface to the outer surface of the respective conductive pipe;
   the one other slots in said pipes being substantially overlapping and adapted to receive said at least one other magnetic flux sensor.

10. The alternating current sensor of claim 9, wherein said magnetic flux sensor comprise conductive coils.

* * * * *